(12) United States Patent
Tokuda et al.

(10) Patent No.: US 7,504,707 B2
(45) Date of Patent: Mar. 17, 2009

(54) SEMICONDUCTOR DEVICE AND MANUFACTURING METHOD THEREOF

(75) Inventors: Norifumi Tokuda, Tokyo (JP); Shigeru Kusunoki, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 103 days.

(21) Appl. No.: 10/515,346

(22) PCT Filed: Jun. 5, 2003

(86) PCT No.: PCT/JP03/07168

§ 371 (c)(1),
(2), (4) Date: Dec. 3, 2004

(87) PCT Pub. No.: WO2004/109808

PCT Pub. Date: Dec. 16, 2004

(65) Prior Publication Data

US 2005/0212057 A1  Sep. 29, 2005

(51) Int. Cl.
*H01L 23/58* (2006.01)

(52) U.S. Cl. .................................................. 257/565

(58) Field of Classification Search ............... 257/295, 257/777, 331, 575, 565, 542, 539, 526, 517, 257/378, 373, 370; 361/100
See application file for complete search history.

(56) References Cited

U.S. PATENT DOCUMENTS 5,841,197 A * 11/1998 Adamic, Jr. ................. 257/777
6,072,214 A * 6/2000 Herzer et al. ............... 257/331
6,362,499 B1 * 3/2002 Moise et al. ................ 257/295
6,392,859 B1 * 5/2002 Ohshima .................... 361/100

FOREIGN PATENT DOCUMENTS

| EP | 0 739 749 A2 | 9/1996 |
|----|----|----|
| EP | 0 739 749 A3 | 9/1996 |
| JP | 56-1566 | 1/1981 |
| JP | 59-40574 | 3/1984 |
| JP | 59-63719 | 4/1984 |
| JP | 61-23350 | 1/1986 |
| JP | 2-67766 | 3/1990 |
| JP | 3-126264 | 5/1991 |
| JP | 3-268363 | 11/1991 |
| JP | 4-42971 | 2/1992 |
| JP | 07-263669 | 10/1995 |
| JP | 11-97715 | 4/1999 |
| JP | 11-274484 | 10/1999 |
| JP | 2001-44088 | 2/2001 |
| JP | 2002-299635 | 10/2002 |

\* cited by examiner

*Primary Examiner*—Jack Chen
*Assistant Examiner*—Monica D Harrison
(74) *Attorney, Agent, or Firm*—Oblon, Spivak, McClelland, Maier & Neustadt, P.C.

(57) ABSTRACT

A semiconductor device in which a main current flows in a direction of the thickness of a semiconductor substrate, to attain desirable electric characteristics. P type semiconductor regions and N type semiconductor regions are alternately provided with an interval therebetween, both regions in a surface of a second main surface of a semiconductor substrate. Between the P type semiconductor regions and the N type semiconductor regions, trenches formed in the surface of the semiconductor substrate are filled with insulators, thereby forming trench isolation structures. Moreover, a second main electrode is formed in contact with both the P type semiconductor regions and the N type semiconductor regions.

3 Claims, 12 Drawing Sheets

F I G . 3
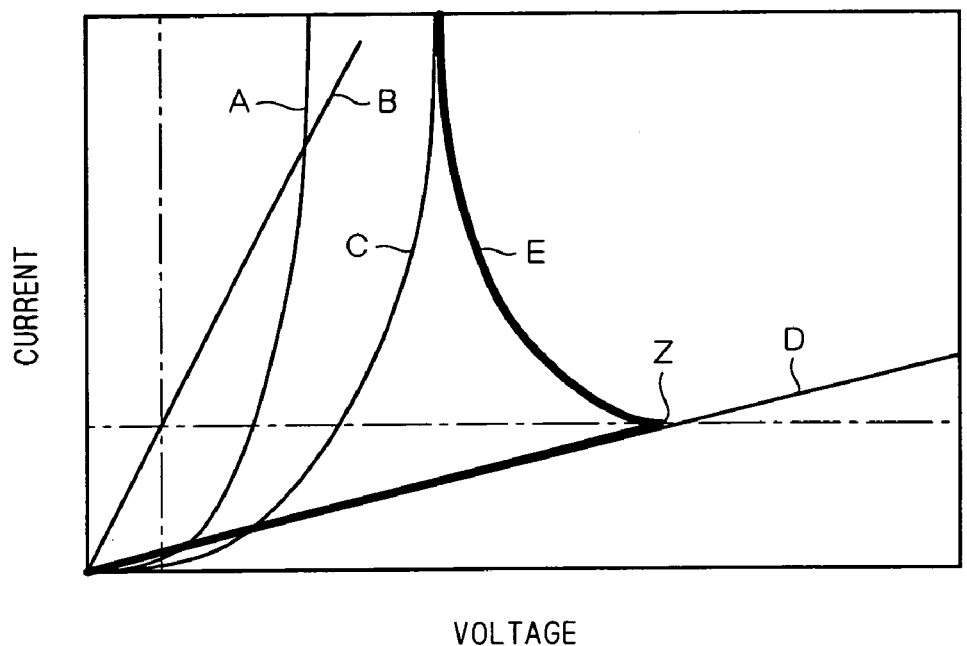

F I G . 9
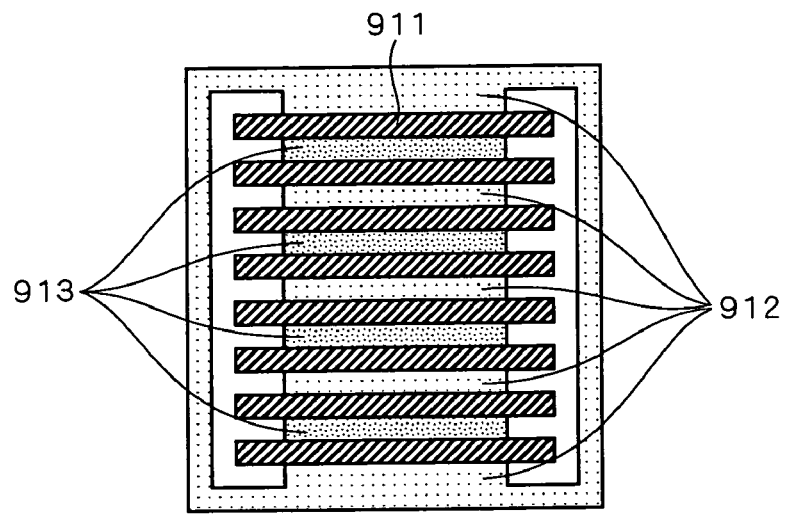
F I G . 1 0
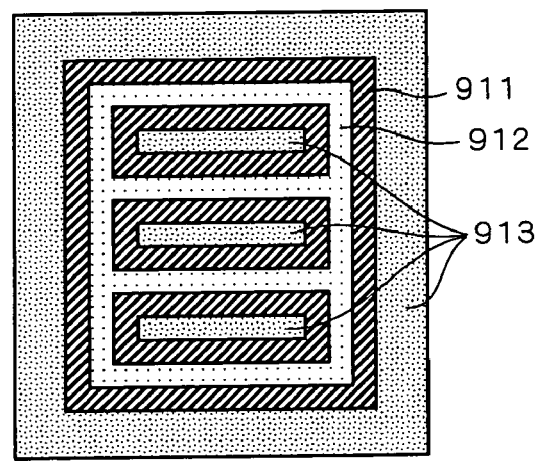

F I G . 1 4
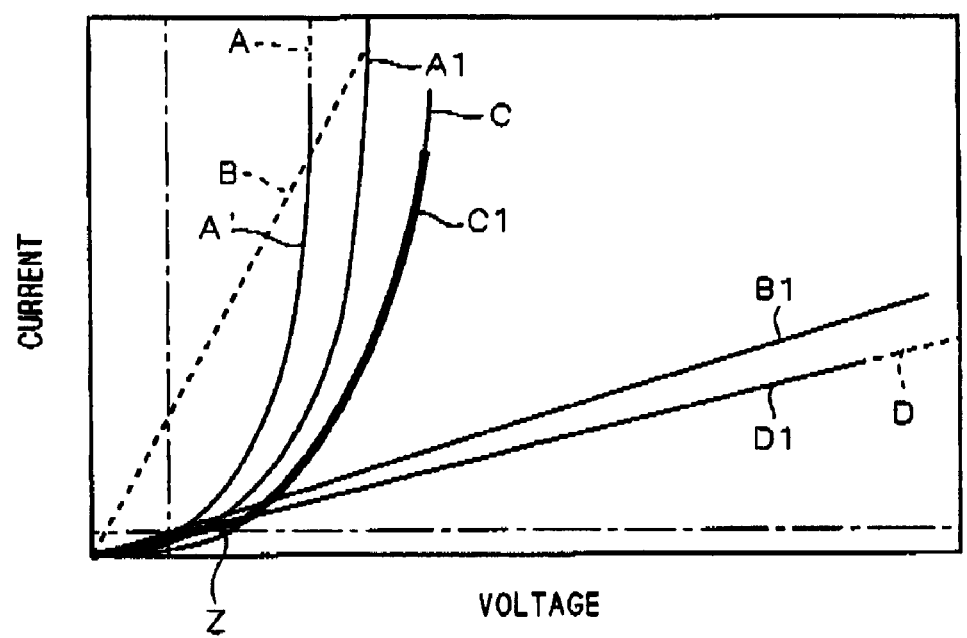

SEMICONDUCTOR DEVICE AND MANUFACTURING METHOD THEREOF

TECHNICAL FIELD

The present invention relates to a semiconductor device, and more specifically, a semiconductor device in which a main current flows in a direction of the thickness of a semiconductor substrate.

BACKGROUND ART

As an example of a semiconductor device in which a main current flows in a direction of the thickness of a semiconductor substrate, a structure is suggested where an IGBT (insulated gate bipolar transistor) element and a diode element in parallel connection with the IGBT element are adjacently formed.

For example, Japanese Patent Application Laid-Open No. 11-097715 discloses an example where gate electrode structures are formed on a first main surface side of a semiconductor substrate, P type impurity regions and N type impurity regions are alternately and adjacently formed in a surface of a second main surface, the P type impurity regions and the gate electrode structures constitute an IGBT region, and the N type impurity regions and the gate electrode structures constitute a diode region.

In such a structure, since the P type impurity regions and the N type impurity regions on the second main surface side are in contact with each other, for example, a phenomenon called snapback occurs, resulting in a loss of energy in a switching operation of an IGBT element, thereby leading to an inability to obtain desirable electric characteristics.

DISCLOSURE OF INVENTION

An object of the present invention is to provide a semiconductor device in which a main current flows in a direction of the thickness of a semiconductor substrate that enables to attain desirable electric characteristics when semiconductor elements with a different function are adjacently arranged.

A semiconductor according to the present invention includes a first main electrode provided on a first main surface of a semiconductor substrate, a second main electrode provided on a second main surface of the semiconductor substrate, and at least one trench-type gate electrode provided in a surface of the first main surface. A main current flows in a direction of the thickness of the semiconductor substrate. The semiconductor substrate includes at least one trench isolation structure provided in a surface of the second main surface, and a first impurity region of a first conductivity type and a second impurity region of a second conductivity type provided in a surface of the second main surface. At least one trench isolation structure is formed by filling a trench provided in a surface of the second main surface with an insulator or a semiconductor of a conductivity type reverse to that of the semiconductor substrate. The trench isolation structure is provided so as to separate the first impurity region and the second impurity region.

The semiconductor device of the present invention is applicable, for example, in a case where the first impurity region is used as a drain region of a MOSFET element and a cathode region of a diode element and the second impurity region is used as a collector region of an IGBT element. In this case, the presence of at least one trench isolation structure causes a resistance value of a current path during an IGBT element operation to increase and a current that flows through the current path upon modulation to decrease. Therefore, snapback can be suppressed. Further, by providing at least one trench isolation structure, snapback can be suppressed without reducing the proportion of an area of an effective region (the sum of areas of the first impurity region and the second impurity region) in the second main surface. Therefore, an increase of an ON voltage during an IGBT element operation and a forward voltage Vf during a diode element operation as well as an increase of a local current density during respective operations can be prevented.

The present invention is intended for a manufacturing method of a semiconductor device including a first main electrode provided on a first main surface of a semiconductor substrate, a second main electrode provided on a second main surface of the semiconductor substrate, and at least one trench-type gate electrode provided in a surface of the first main surface, wherein a main current flows in a direction of the thickness of the semiconductor substrate. According to the present invention, the method includes the following steps of (a) through (c). The step (a) is to form at least one trench in a surface of the second main surface after forming the structure on the side of the first main surface in a semiconductor wafer state. The step (b) is to form in the semiconductor wafer state an insulator layer or a semiconductor layer of a conductivity type reverse to that of the semiconductor substrate entirely on the second main surface to fill the insulator layer or the semiconductor layer inside at least one trench. The step (c) is to remove the insulator layer or the semiconductor layer on the second main surface to obtain at least one trench isolation structure.

According to the manufacturing method of the semiconductor device of the present invention, at least one trench isolation structure provides, for example, a configuration where an impurity region functioning as a drain region of a MOSFET element and a cathode region of a diode element is separated from an impurity region functioning as a collector region of an IGBT element. Under this configuration, the presence of at least one trench isolation structure causes a resistance value of a current path during a MOSFET element operation to increase and a current that flows through the current path upon modulation to decrease. Therefore, snapback can be suppressed. Further, by providing at least one trench isolation structure, snapback can be suppressed without reducing the proportion of an area of an effective region (the sum of areas of the first impurity region and the second impurity region) in the second main surface. Therefore, an increase of an ON voltage during an IGBT element operation and a forward voltage Vf during a diode element operation as well as an increase of a local current density during respective operations can be prevented.

These and other objects, features, aspects and advantages of the present invention will become more apparent from the following detailed description of the present invention when taken in conjunction with the accompanying drawings.

BRIEF DESCRIPTION OF DRAWINGS

FIG. 3 shows an operating characteristic of the semiconductor device for explaining developments of the present invention.

FIG. 9 illustrates an example of a plane structure of the semiconductor device according to the embodiment of the present invention.

FIG. 10 illustrates an example of a plane structure of the semiconductor device according to the embodiment of the present invention.

FIG. 14 illustrates an operating characteristic of the semiconductor device according to the embodiment of the present invention.

BEST MODE FOR CARRYING OUT THE INVENTION

Figure 1:
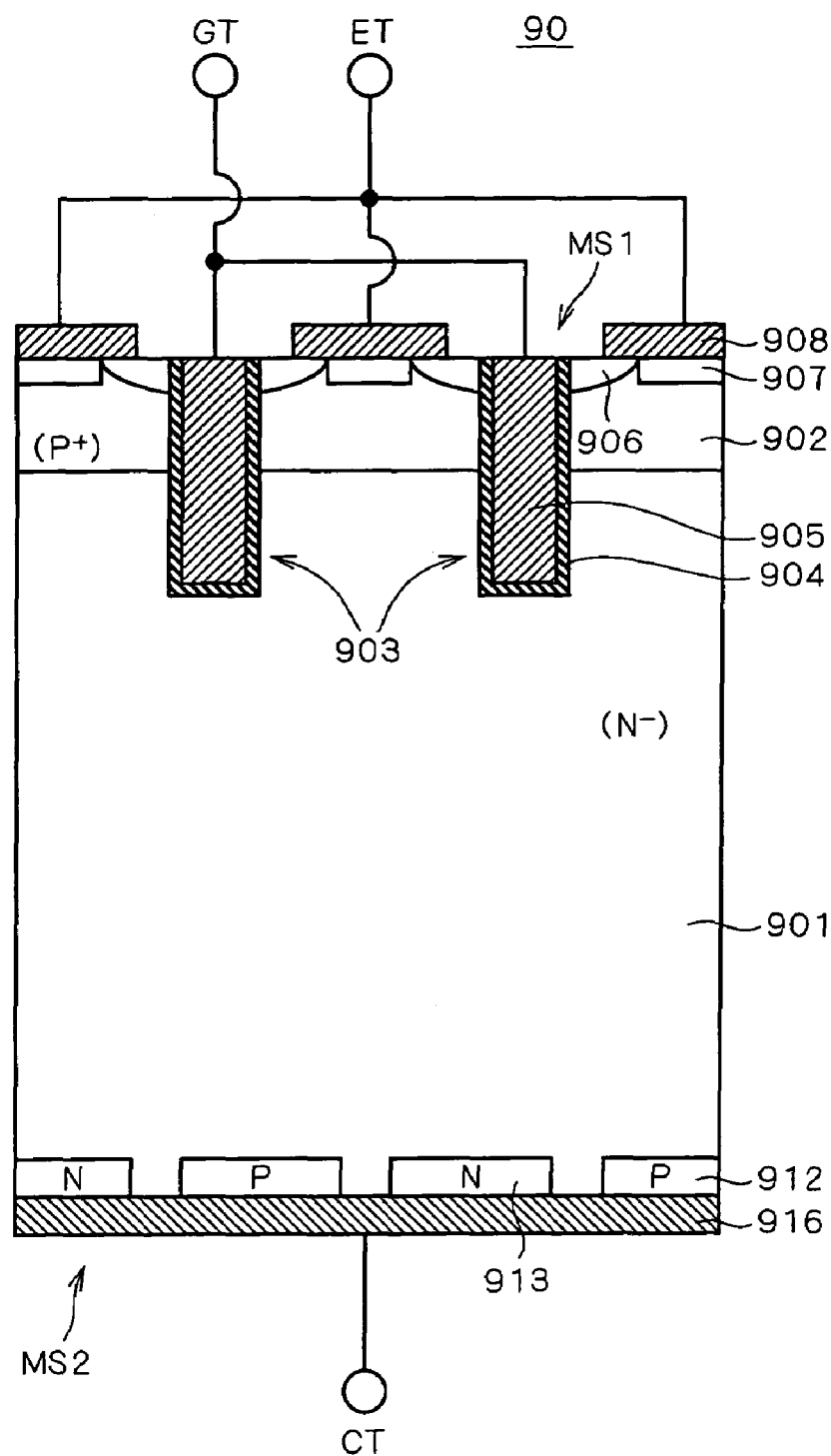
FIG. 1 is a section view showing a structure of a semiconductor device for explaining developments of the present invention.
Figure 2:
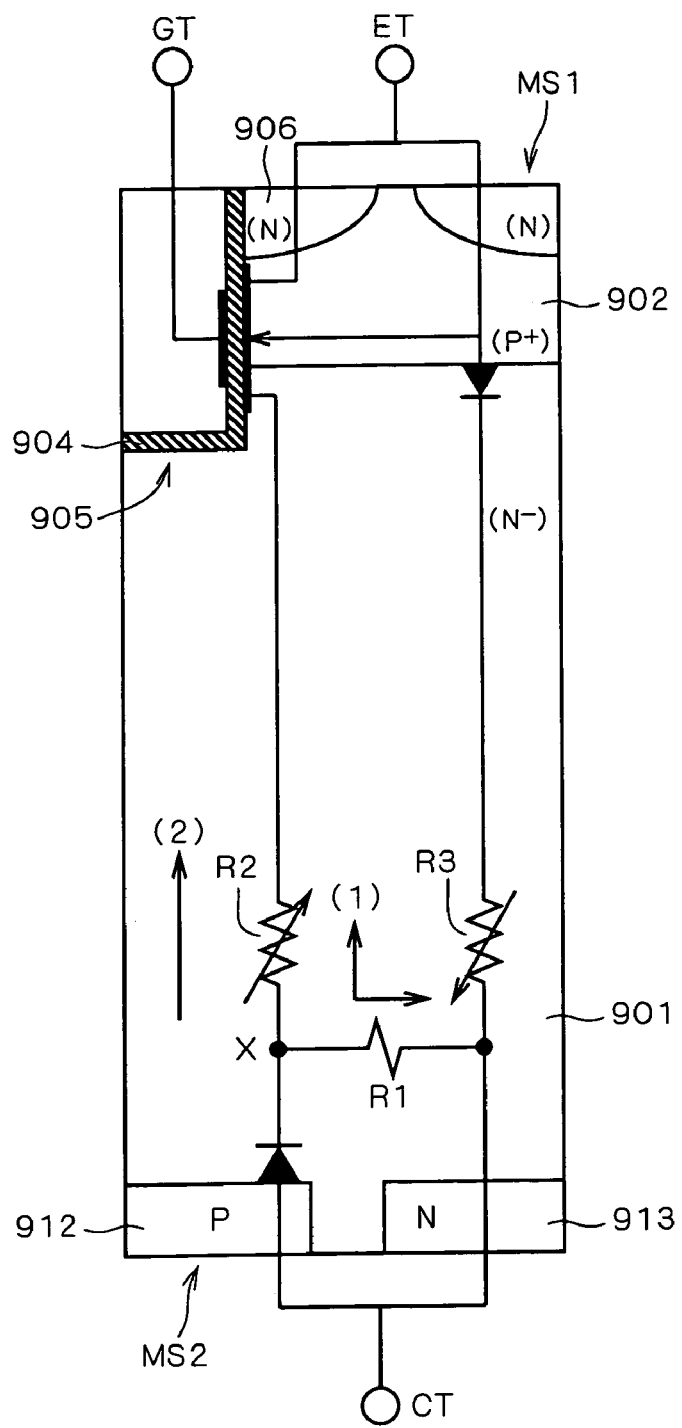
FIG. 2 shows an equivalent circuit illustrating an operation of the semiconductor device for explaining developments of the present invention.

Prior to describing an embodiment according to the present invention, description is given as to how the technical idea of the present invention has been developed with reference to FIGS. 1 through 3.

FIG. 1 is a section view illustrating a basic structure of a semiconductor device 90 intended to solve the problem with the conventional semiconductor device.

In the configuration of the semiconductor device 90 shown in FIG. 1, a P type semiconductor region 902 is formed entirely across in a surface of a first main surface MS1 of a semiconductor substrate 901 that is an N type substrate having a high specific resistance ($N^-$).

Then, two trenches 903 are provided penetrating the P type semiconductor region 902 from the first main surface MS1 and reaching inside the semiconductor substrate 901. Inner walls of trenches 903 are covered with gate insulating films 904. Further, conductive materials fill inside trenches 903 covered with the gate insulating films 904 to form trench-type gate electrodes 905.

Also, N type semiconductor regions 906 of a relatively high concentration ($N^+$) are selectively formed in the surface of the P type semiconductor region 902 so that at least a part of the N type semiconductor regions 906 comes in contact with the gate insulating films 904. The N type semiconductor regions 906 are provided on both sides of each of the two trenches 903. P type semiconductor regions 907 of a relatively high concentration ($P^+$) are formed between a pair of the N type semiconductor regions 906 sandwiched by the trenches. The P type semiconductor regions 907 provide a structure for obtaining a preferable electric contact for the P type semiconductor region 902.

Further, first main electrodes 908 are provided in contact with the top of the N type semiconductor regions 906 and the P type semiconductor regions 907 adjacent to each other.

The first main electrodes 908 apply a potential from an external terminal ET to the N type semiconductor regions 906 and the P type semiconductor regions 907. In response to an operation of the semiconductor device 90, at some time the first main electrodes 908 function as an emitter electrode and at other times they function as an anode electrode or a source electrode. Further, a control voltage is applied from an external terminal GT to the trench-type gate electrodes 905.

P type semiconductor regions 912 and N type semiconductor regions 913 are alternately provided with an interval therebetween, both regions in a surface of a second main surface MS2 of the semiconductor substrate 901. Further, a second main electrode 916 is provided contacting both the P type semiconductor regions 912 and the N type semiconductor regions 913.

With the P type semiconductor regions 912 and the N type semiconductor regions 913 arranged apart, this structure is intended to improve electric characteristics.

The second main electrode 916 applies a potential from an external terminal CT to the P type semiconductor regions 912 and the N type semiconductor regions 913. At some time the second main electrode 916 functions as a collector electrode, and at other times it functions as a cathode electrode or a drain electrode.

Next, description is given of an operation of the semiconductor device 90 in reference to FIGS. 2 and 3. FIG. 2 shows an equivalent circuit schematically illustrating function of the semiconductor device 90. FIG. 2 shows that the semiconductor device 90 functions as an IGBT element and a diode element in an inverse-parallel connection with the IGBT element. Further, FIG. 3 shows current-voltage characteristics of the semiconductor device 90.

FIG. 2 shows that the P type semiconductor region 912 and the N type semiconductor region 913 are provided in a surface of the second main surface MS2 with an interval therebetween. Under this configuration, when a ground potential is supplied to the external terminal ET, a positive potential is supplied to the external terminal CT and an ON signal is supplied to the external terminal GT, a current path (1) and a current path (2) are formed leading to the first main surface MS1 side. The current path (1) starts from the N type semiconductor region 913, goes through a path having resistors R1 and R2 inside the semiconductor substrate 901 and a channel region formed inside the P type semiconductor region 902 in contact with the gate insulating film 904, and reaches the N type semiconductor region 906. The current path (2) starts from the P type semiconductor region 912, goes through a path having the resistor R2 inside the semiconductor substrate 901 and the channel region formed inside the P type semiconductor region 902 in contact with the gate insulating film 904, and reaches the N type semiconductor region 906.

In this case, the current path (1) is taken during an operation as a so-called MOSFET element, and the current path (2) is taken during an operation as a so-called IGBT element.

Further, when a ground potential is supplied to the external terminal ET, a negative potential is supplied to the external terminal CT and an OFF signal is supplied to the external terminal GT, the semiconductor device 90 functions as a diode element. Therefore, a current flows through the N type semiconductor region 913 via a path having a resistor R3 inside the semiconductor substrate 901.

If a portion inside the semiconductor substrate 901 near the P type semiconductor region 912 is called an X, a resistance value of the resistor R1 between the X and the N type semiconductor region 913 is very small when the N type semiconductor region 913 and the P type semiconductor region 912 are close.

Additionally in FIG. 2, regarding the resistors R2 and R3 inside the semiconductor substrate 901 during an IGBT element operation and a diode element operation, respectively, modulation is generated and a resistance value decreases as a voltage increases. Accordingly, a symbol indicating a variable resistor is used for the resistors R2 and R3. However, in case of a MOSFET element operation, the resistance value is approximately constant.

FIG. 3 conceptually shows current-voltage characteristics of the semiconductor device 90. That is, in FIG. 3, the horizontal axis represents voltage value and the vertical axis represents current value, to indicate four kinds of current-voltage characteristics that are characteristics A, B, C and D.

The characteristic A shows the relationship of a current flowing at the external terminal CT and a potential difference between the external terminal CT and the X when the N type semiconductor region 913 is in an open state without being connected to the external terminal CT.

The characteristic B shows the relationship of a current flowing at the external terminal CT and a potential difference between the external terminal CT and the X when the P type semiconductor region 912 is in an open state without being connected to the external terminal CT.

The characteristic C shows the relationship of a current flowing at the external terminal CT and the potential difference between the external terminal CT and the external terminal ET when the N type semiconductor region 913 is in an open state without being connected to the external terminal CT.

The characteristic D shows the relationship of a current flowing at the external terminal CT and the potential difference between the external terminal CT and the external terminal ET when the P type semiconductor region 912 is in an open state without being connected to the external terminal CT.

The characteristic B is a straight line with a slope of 1/R1, and the characteristic A indicates that almost no current flows before a potential difference between the external terminal CT and the X reaches approximately 0.6V.

Next, description is given of a case when the N type semiconductor region 913 and the P type semiconductor region 912 are both connected to the external terminal CT.

When the current level is low, the potential difference between the external terminal CT and the X is small and the IGBT element does not operate. Therefore, mainly the MOSFET element operates and a current flows virtually through the current path (1).

Then, when modulation is generated, the IGBT element operates and a current starts to flow, that is, when a potential difference between the external terminal CT and the X reaches about 0.6V, the characteristic D takes a current value and a voltage value as represented by a Z.

Hereinafter, a voltage when the IGBT element operation prompts a current to flow, that is, a voltage when modulation starts to be generated, is defined as a modulation voltage Vmod.

Further, when an attempt is made to supply a current over the level indicated by the Z, the IGBT element operation through the current path (2) gradually takes over. Since the amount of a current prompted by the IGBT element operation increases exponentially while the amount of a current prompted by the MOSFET element operation increases only linearly, when a current over the level indicated by the Z is supplied, a phenomenon where a potential difference between the external terminal CT and the external terminal ET decreases, namely, a snapback phenomenon, is observed.

FIG. 3 shows a characteristic E indicating that a current increases sharply as a voltage decreases with the Z on the characteristic D as a turn-round. This characteristic corresponds to a snapback phenomenon.

Additionally, a negative resistance region where a snapback phenomenon is observed is referred to as a snapback region.

Observing a switching operation with passage of time, when a snapback phenomenon occurs, a period of time arises when both a current and a voltage increase. This leads to a loss of energy.

As described above, even under a configuration where the P type semiconductor region 912 and the N type semiconductor region 913 are provided without contacting each other, a snapback phenomenon occurs if both regions are close. By further increasing the interval between the N type semiconductor region 913 and the P type semiconductor region 912, a proportion of an area of an effective region (the sum of areas of the P type semiconductor region 912 and the N type semiconductor region 913) in the second main surface MS2 decreases. This shifts the characteristics A and C slightly to the higher voltage side (to the right of FIG. 3).

Further, an increased interval between the P type semiconductor region 912 and the N type semiconductor region 913 causes the resistance value of the resistor R1 (FIG. 2) to increase. This lessens the slope of the characteristic B.

Furthermore, in case the interval between the P type semiconductor region 912 and the N type semiconductor region 913 is widened but the area of a semiconductor chip is not increased, naturally the area of the N type semiconductor region 913 decreases and the area of the N type semiconductor region 913 in proportion to the semiconductor chip decreases. As a result, the characteristic D shows a slightly lower slope.

Moreover, an increased value of the resistor R1 between the P type semiconductor region 912 and the N type semiconductor region 913 lessens the slope of the characteristic B. Therefore, even when a potential difference between the external terminal CT and the X reaches about 0.6 V, a current flow prompted by the MOSFET element operation is not so large and a potential difference between the external terminal CT and the external terminal ET is small, thereby suppressing snapback. Here, when a potential difference between the external terminal CT and the X reaches about 0.6 V, that is, at the Z, the following relationship holds: Vmod=R1×id. The id refers to an operating current of the MOSFET element, that is, a current flowing through the current path (1). In this case, it particularly refers to a current value at the Z.

However, as mentioned above, an increased interval between the P type semiconductor region 912 and the N type semiconductor region 913 decreases the proportion of an area of an effective region in the second main surface MS2. This increases an ON voltage during the IGBT element operation and a forward voltage Vf during the diode element operation, or increases a local current density during respective operations.

The snapback can also be suppressed by decreasing the area of the N type semiconductor region 913 in proportion to the P type semiconductor region 912. Therefore, if the area of the N type semiconductor region 913 is made extremely small in proportion to the P type semiconductor region 912, it is possible to make snapback unobservable. However, decreased area of the N type semiconductor region 913 causes a forward voltage Vf to increase during a diode element operation, or a current density to increase to a very large extent that a diode element may be damaged.

In this regard, the inventors of the present application reached a technical idea that a trench is provided in the surface of the semiconductor substrate 901 between the N type semiconductor region 913 and the P type semiconductor region 912. In the following, as the embodiment according to the present invention, description is given of structure and operation of a semiconductor device 100 created based on the above technical concept.

A. Device Structure

A-1. Sectional Structure

Figure 4:
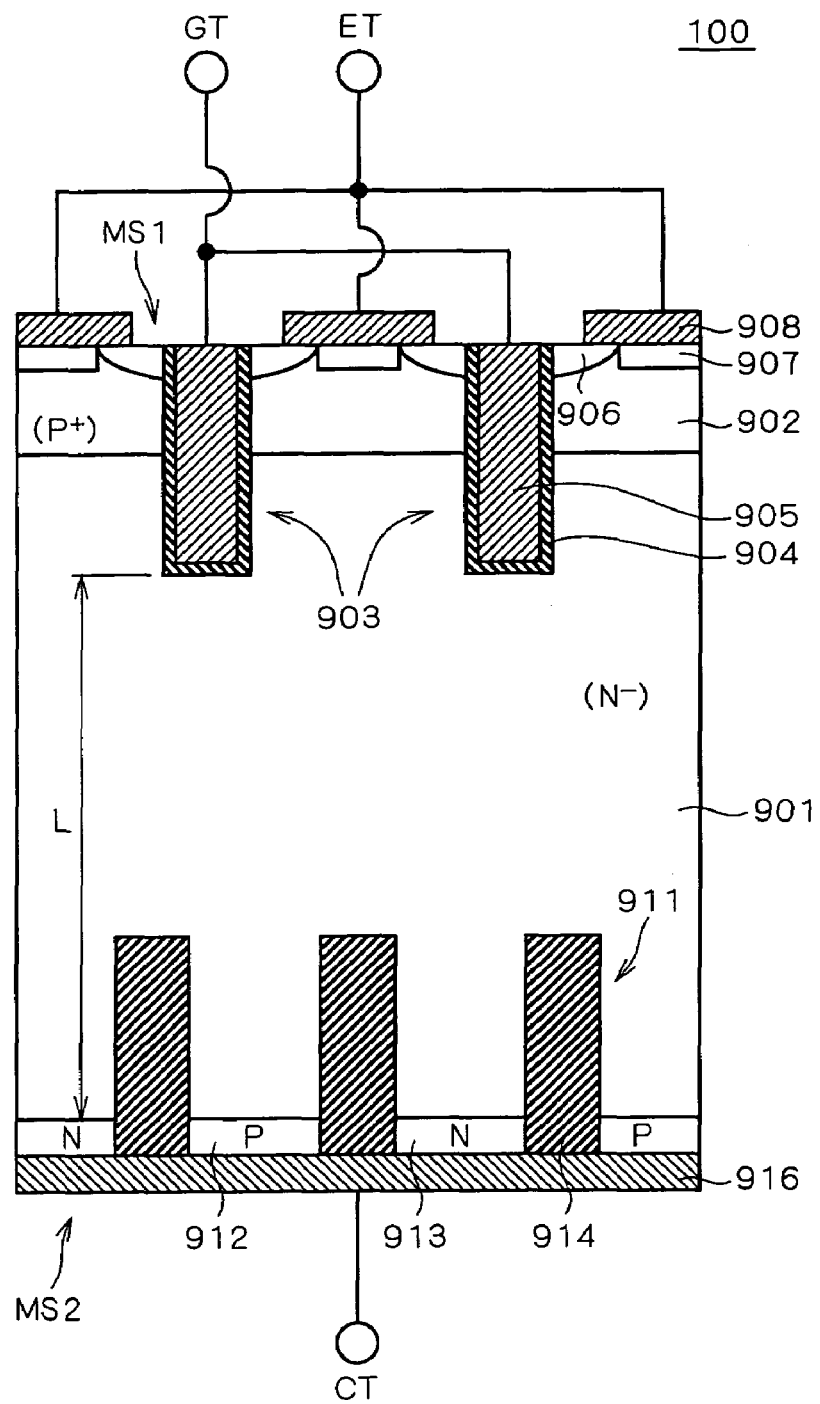
FIG. 4 is a section view showing a structure of a semiconductor device according to an embodiment of the present invention.

FIG. 4 is a section view showing a basic structure of the semiconductor device 100.

The semiconductor device 100 shown in FIG. 4 is so configured that the P type semiconductor region 902 is formed entirely across in a surface of the first main surface MS1 of the semiconductor substrate 901 that is an N type substrate having a high specific resistance ($N^-$). Depending on a withstand voltage level, a specific resistance and a distance L between the bottom of the P type semiconductor regions 912 and the bottom of the trenches 903 of the semiconductor substrate 901 vary. For example, at a withstand voltage level of 1200V, the specific resistance is set to 40 to 60 Ωcm and the distance L is set to about 100 to 200 μm. For lower withstand voltage levels, the specific resistance is set to a lower value and the distance L is set to a smaller value.

Then, two trenches 903 are provided penetrating the P type semiconductor region 902 from the first main surface MS1 and reaching inside the semiconductor substrate 901. Inner walls of the trenches 903 are covered with gate insulating films 904. Further, conductive materials fill inside the trenches 903 covered with the gate insulating films 904 to form trench-type gate electrodes 905.

When the semiconductor device 100 functions as a MOSFET element or an IGBT element, the P type semiconductor region 902 serves as a body region including a channel region. Therefore, an impurity concentration and a depth of the P type semiconductor region 902 are determined based on a threshold voltage of the MOSFET or the IGBT.

The impurity concentration and a diffusion depth are determined by an ion implantation condition or a thermal diffusion condition. For example, the impurity concentration is usually set to be $1 \times 10^{17}$ atoms/cm$^3$ to $1 \times 10^{18}$ atoms/cm$^3$ in an area contacting a source electrode of the MOSFET or an emitter electrode of the IGBT. The diffusion depth is set to be several μms so as not to exceed the trenches 903.

Further, respective trenches 903 are formed by etching at pitch of 2 to 10 μm, with a width set between 0.5 to 3.0 μm and a depth set between 3 to 20 μm.

The gate insulating films 904 formed on the surface of the inner wall of the trenches 903 are insulating films constituting the MOSFET, and have an optimum thickness specified based on a gate drive voltage, a saturated current, a capacitance and the like. Generally, a silicon oxide film with a thickness of 10 to 200 nm is used to form the gate insulating films 904 by thermal oxidation, deposition and the like.

The trench-type gate electrodes 905 filled inside the trenches 903 comprise a polycrystalline silicon film of a high impurity concentration, a metal material with a high melting point such as tungsten silicide and the like, or a multilayered film structure of these. Generally, the trench-type gate electrodes 905 are obtained by depositing a conductive film thicker than half the width of the trenches 903 over the first main surface MS1 then planarizing the film by anisotropic etching and the like. Also, the trench-type gate electrodes 905 are obtained by forming a mask with a predetermined pattern by photo lithography then depositing a conductive film and performing etching.

An optimal concentration of the P type semiconductor region 902 varies depending on a work function value of a material of the trench-type gate electrodes 905. In an extreme case, an N type semiconductor region is provided along the side of the trenches 903 and a thin layer having the same conductivity type as that of an emitter region (N type) is provided in a region contacting the gate insulating films 904, thereby forming a buried channel structure.

Also, the N type semiconductor regions 906 of a relatively high concentration ($N^+$) are selectively formed in the surface of the P type semiconductor region 902 so that at least a part of the N type semiconductor regions 906 comes in contact with the gate insulating films 904. The N type semiconductor regions 906 are provided on both sides of each of the two trenches 903. The P type semiconductor regions 907 of a relatively high concentration ($P^+$) are formed between a pair of the N type semiconductor regions 906 sandwiched by the trenches. The P type semiconductor regions 907 provide a structure for obtaining a preferable electric contact for the P type semiconductor region 902.

The N type semiconductor regions 906 and the P type semiconductor regions 907 are both formed through patterning by photo lithography and ion implantation so as to have a surface concentration of over $1 \times 10^{20}$ atoms/cm$^3$, for example.

Further, the first main electrodes 908 are provided in contact with the top of the N type semiconductor regions 906 and the P type semiconductor regions 907 adjacent to each other.

The first main electrodes 908 apply a potential from the external terminal ET to the N type semiconductor regions 906 and the P type semiconductor regions 907. In response to an operation of the semiconductor device 90, at some time the first main electrodes 908 function as an emitter electrode and at other times they function as an anode electrode or a source electrode. Further, a control voltage is applied from the external terminal GT to the trench-type gate electrodes 905.

The first main electrodes 908 are formed by processing an interlayer insulating film (not shown) formed so as to cover the N type semiconductor regions 906 and the P type semiconductor regions 907 by photo lithography and etching to selectively create an opening, then depositing a conductive film comprising a compound of aluminum and silicon, for example.

Further, a protective film (not shown) is formed on the first main electrodes 908, and a connection to an external power source is made through an opening portion provided at a predetermined position of the protective film.

The P type semiconductor regions 912 and the N type semiconductor regions 913 are alternately provided with an interval therebetween, both regions in the second main surface MS2 of the semiconductor substrate 901. Between the P type semiconductor regions 912 and the N type semiconductor regions 913, trenches in the surface of the semiconductor substrate 901 are filled with insulators 914, thereby forming trench isolation structures 911.

An impurity concentration of the P type semiconductor regions 912 and the N type semiconductor regions 913 is both from $1\times10^{16}$ atoms/cm$^3$ to $1\times10^{21}$ atoms/cm$^3$. For example, the regions are formed through ion implantation to implant a predetermined impurity, then annealing for activation. However, depending on a property of a semiconductor device, in some cases an impurity concentration outside the above-mentioned range is acceptable and in some other cases annealing is not required.

Further, the second main electrode 916 is provided contacting both the P type semiconductor regions 912 and the N type semiconductor regions 913. It is noted that the trench isolation structures 911 are provided in a surface of the second main surface MS2 so that an exposed surface of the trench isolation structures 911 is level with an exposed surface of the P type semiconductor regions 912 and the N type semiconductor regions 913. Further, the second main electrode 916 is provided so as to cover the top of the trench isolation structures 911.

The second main electrode 916 applies a potential from the external terminal CT to the P type semiconductor regions 912 and the N type semiconductor regions 913. At some time the second main electrode 916 functions as a collector electrode, and at other times it functions as a cathode electrode or a drain electrode.

The trench isolation structures 911 are formed by anisotropic etching and the like, to have an optimum depth determined based on a specific resistance of the semiconductor substrate 901, an impurity concentration of the N type semiconductor regions 913 and the P type semiconductor regions 912, an area ratio of both regions, a material of the insulators 914 constituting the trench isolation structures 911, and throughput.

Further, any value can be given for the a width and an arrangement interval of the trench isolation structures 911. For example, the width is set to 0.2 to 100 μm and the arrangement interval is set to 0.5 to 500 μm.

A material and a size for the insulators 914 constituting the trench isolation structures 911 are decided so that an electrical charge therein has a polarity reverse to an electrical charge inside the semiconductor substrate 901 and that the total quantity of the electrical charge of all the trench isolation structures 911 is approximately equal to the quantity of the electrical charge of a section of the semiconductor substrate 901 from the surface of the second main surface MS2 to the bottom of the trench isolation structures 911. For example, assuming that an N type impurity concentration of the semiconductor substrate 901 is n (atoms/cm$^3$), a width, a depth and a thickness of the trench isolation structures 911 are W, t and x, respectively, the distance between centerlines of the trench isolation structures 911 (trench arrangement pitch) is P, and an elementary quantity of electricity is q, then a section of the semiconductor substrate 901 sandwiched by two trench isolation structures 911 has a negative electrical charge of qn·(P−W)tx. Therefore, a material of the insulators 914 is decided so that a positive electrical charge equal in quantity to the above negative electrical charge is present inside each of the trench isolation structures 911. More specifically, an insulator having a constant electrical charge density of n·(P−W)/W is used.

Set in this manner, a Reduced Surface Field (RESURF) effect allows a withstand voltage level to increase with stability, thereby making it possible to reduce the thickness of the semiconductor substrate 901. Further, since a concentration of the semiconductor substrate 901 can be increased, it is possible to lower an ON voltage for an IGBT element and a forward voltage Vf for a diode element, thereby alleviating a loss of energy.

When the semiconductor device 100 operates as an IGBT element, the first main electrodes 908 function as an emitter electrode, the second main electrode 916 functions as a collector electrode, and the N type semiconductor regions 906 formed in the first main surface MS1 function as an emitter region. Further, the P type semiconductor region 902 functions as a body region including a channel region and the P type semiconductor regions 907 function as a body contact region.

Moreover, when operating as a diode element, the first main electrodes 908 function as an anode electrode, the second main electrode 916 functions as a cathode electrode, and the P type semiconductor region 902 formed in the first main surface MS1 functions as an anode region. Further, the P type semiconductor regions 907 function as an anode contact region and the N type semiconductor regions 913 formed on the side of the second main surface MS2 functions as a cathode region.

Furthermore, when operating as a MOSFET element, the first main electrodes 908 function as a source electrode, the second main electrode 916 functions as a drain electrode, and the N type semiconductor regions 906 function as a source region. Further, the P type semiconductor region 902 functions as a body region including a channel region, the P type semiconductor regions 907 function as a body contact region, and the N type semiconductor regions 913 function as a drain region.

A-2. Planar Structure

Next, description is given of a planar configuration of the trench isolation structures 911, the P type semiconductor regions 912 and the N type semiconductor regions 913, in reference to FIGS. 5 through 11. FIGS. 5, 8 through 11 are plane views illustrating the semiconductor device 100 in a semiconductor chip state seen from the side of the second main surface MS2.

Figure 5:
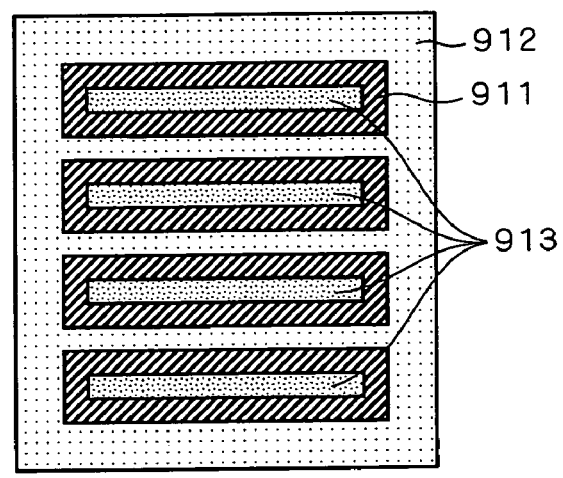
FIG. 5 illustrates an example of a plane structure of the semiconductor device according to the embodiment of the present invention.

FIG. 5 illustrates an example where a plurality of the loop trench isolation structures 911 having a rectangular outline are disposed in parallel with an interval. The N type semiconductor regions 913 are disposed in a region surrounded by the loop trench isolation structure 911. The P type semiconductor region 912 is disposed surrounding the trench isolation structures 911.

Figure 6:
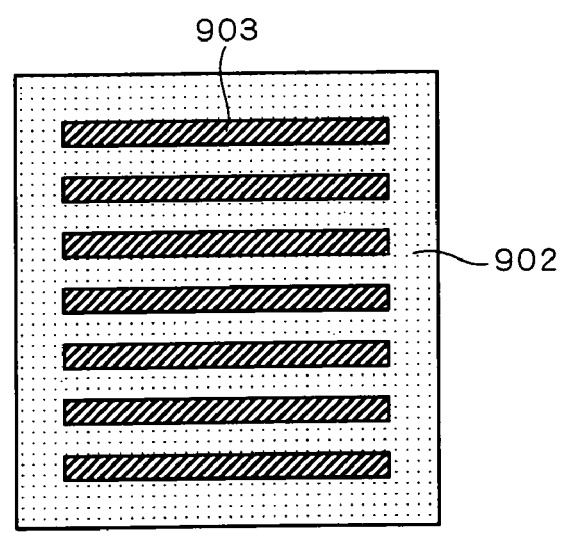
FIG. 6 illustrates an example of a plane structure of the semiconductor deice according to the embodiment of the present invention.
Figure 7:
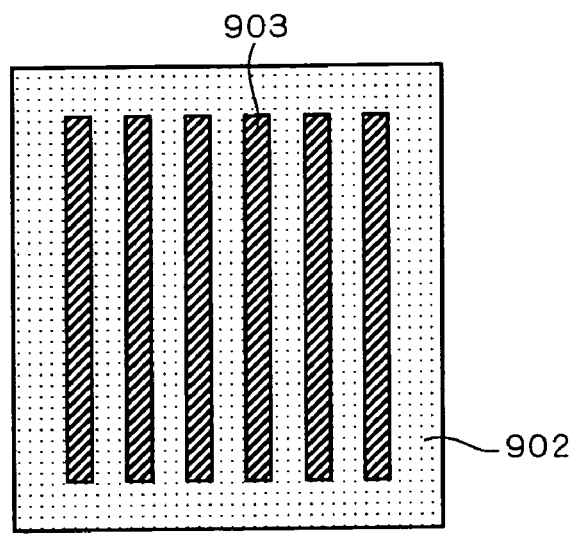
FIG. 7 illustrates an example of a plane structure of the semiconductor device according to the embodiment of the present invention.

FIGS. 6 and 7 show an example of a planar configuration of the trenches 903 seen from the side of the first main surface MS1. In an example shown in FIG. 6, a plurality of striped trenches 903 are disposed in parallel with an interval in the surface of the P type semiconductor region 902. The arranging direction of the trenches 903 corresponds to the arranging direction of the trench isolation structures 911.

Further, an example shown in FIG. 7 also shows a plurality of striped trenches 903 disposed in parallel with an interval in the surface of the P type semiconductor region 902. However, the arranging direction of the trenches 903 is at right angle to the arranging direction of the trench isolation structures 911. It is noted that FIGS. 6 and 7 do not show the N type semiconductor regions 906 and the like for convenience. This arrangement of the trenches 903 and the trench isolation structures 911 with respective arranging directions forming a right angle produces an advantage that a uniform current distribution can be made.

Figure 8:
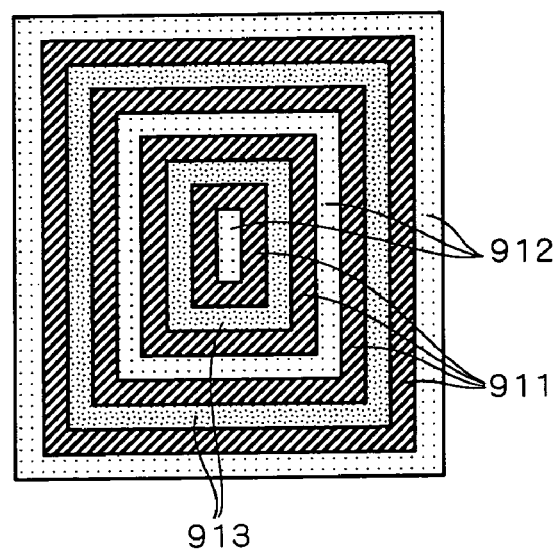
FIG. 8 illustrates an example of a plane structure of the semiconductor device according to the embodiment of the present invention.

FIG. 8 shows an example where a plurality of the loop trench isolation structures 911 having a rectangular outline are concentrically arranged with an interval. In this configuration, the loop formed by the innermost trench isolation structure 911 is the smallest, and the loop becomes larger as a location of respective trench isolation structures 911 moves outwardly. The P type semiconductor region 912 is provided in the region surrounded by the innermost trench isolation structure 911, and the N type semiconductor region 913 is provided surrounding the innermost trench isolation structure 911. In a similar manner, the P type semiconductor regions 912 and the N type semiconductor regions 913 are provided alternately to surround each of the trench isolation structures 911.

FIG. 9 shows an example where a plurality of the striped trench isolation structures 911 are provided in parallel with an interval. The P type semiconductor regions 912 and the N type semiconductor regions 913 are provided alternately between the plurality of the trench isolation structures 911. This alternate arrangement of the P type semiconductor regions 912 and the N type semiconductor regions 913 is employed at a central portion of the trench isolation structures 911. Both ends of the trench isolation structures 911 are formed inside the surface of the semiconductor substrate 901 with a low impurity concentration, and the P type semiconductor region 912 is provided at the periphery of a semiconductor chip.

FIG. 10 shows an example where a plurality of the loop trench isolation structures 911 having a rectangular outline (small loop) are provided in parallel with an interval, while a larger loop trench isolation structure 911 having a rectangular outline (large loop) is provided so as to surround the small loop arrangement. The N type semiconductor regions 913 are provided inside the small loop trench isolation structures 911, while the P type semiconductor region 912 is provided surrounding the small loop trench isolation structure 911. Further, the N type semiconductor region 913 is provided surrounding the large loop trench isolation structure 911.

Figure 11:
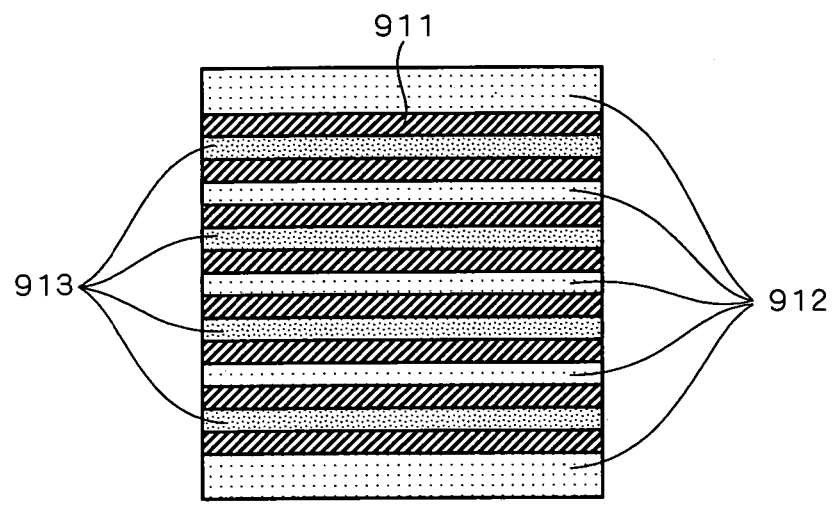
FIG. 11 illustrates an example of a plane structure of the semiconductor device according to the embodiment of the present invention.

FIG. 11 shows an example where a plurality of the striped trench isolation structures 911 are provided in parallel with an interval. The P type semiconductor regions 912 and the N type semiconductor regions 913 are provided alternately between the plurality of the trench isolation structures 911. In this example, the trench isolation structures 911 are extended to reach the edge of a semiconductor chip. The P type semiconductor regions 912 and the N type semiconductor regions 913 are separated from each other by the trench isolation structures 911 and the chip edge.

Figure 12:
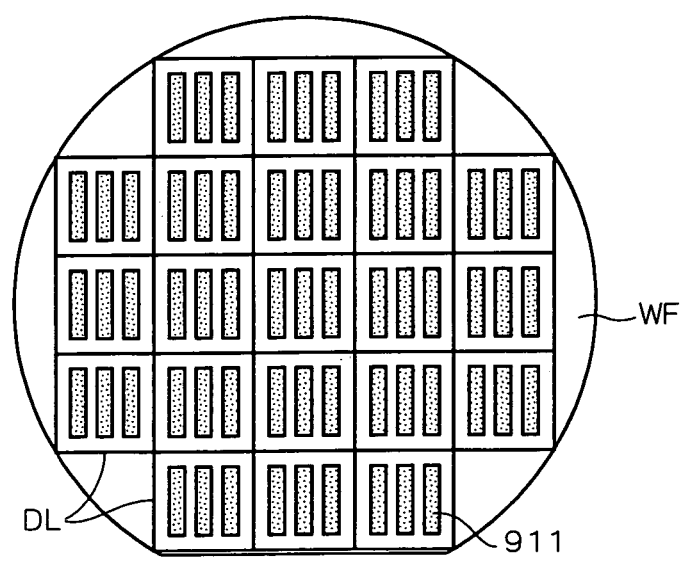
FIG. 12 is a plane view illustrating a structure of the semiconductor substrate wafer employed in a semiconductor device of the present invention.

FIG. 12 shows a planer structure of a semiconductor wafer to obtain semiconductor chips as shown in FIGS. 5 through 11. On a semiconductor wafer WF of FIG. 12, a plurality of the striped trench isolation structures 911 are provided. Dicing lines DL are provided horizontally and vertically for dividing the semiconductor wafer WF into a plurality of semiconductor chips.

B. Operation

Figure 13:
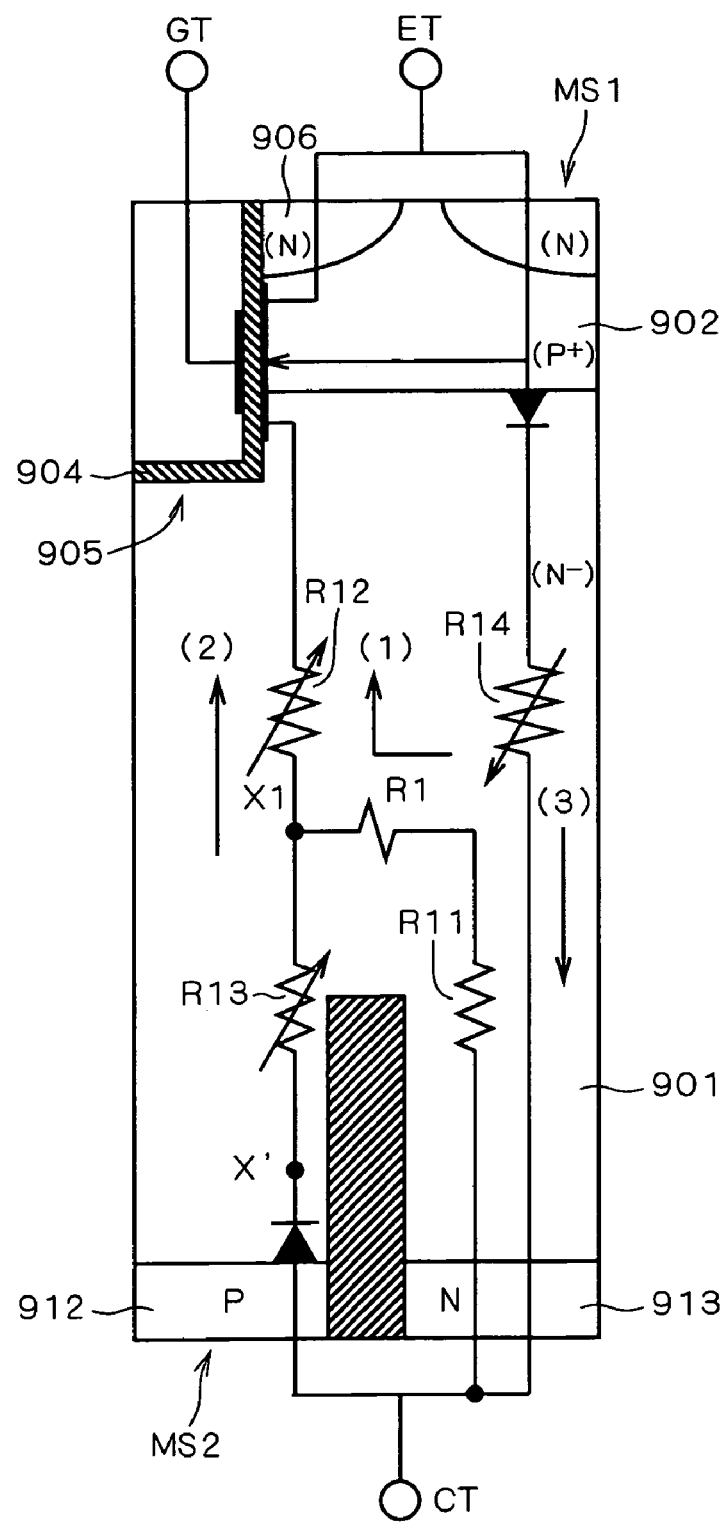
FIG. 13 shows an equivalent circuit illustrating an operation of the semiconductor device according to the embodiment of the present invention.

Next, description is given of an operation of the semiconductor device 100 in reference to FIGS. 13 and 14. FIG. 13 is an equivalent circuit schematically illustrating function of the semiconductor device 100, showing that the semiconductor device 100 functions as an IGBT element and a diode element in an inverse-parallel connection with the IGBT element. Further, FIG. 14 shows current-voltage characteristics of the semiconductor device 100.

FIG. 13 shows that the trench isolation structure 911 is provided in the surface of the semiconductor substrate 901 between the P type semiconductor region 912 and the N type semiconductor region 913. Under this configuration, when a ground potential is supplied to the external terminal ET, a positive potential is supplied to the external terminal CT and an ON signal is supplied to the external terminal GT, the current path (1) and the current path (2) are formed leading to the first main surface MS1 side. The current path (1) starts from the N type semiconductor region 913, goes through a path having resistors R11, R1 and R12 inside the semiconductor substrate 901 and a channel region formed inside the P type semiconductor region 902 in contact with the gate insulating film 904, and reaches the N type semiconductor region 906. The current path (2) starts from the P type semiconductor region 912, goes through a path having resistors R13 and R12 inside the semiconductor substrate 901 and the channel region formed inside the P type semiconductor region 902 in contact with the gate insulating film 904, and reaches the N type semiconductor region 906.

In this case, the current path (1) is taken during an operation as a so-called MOSFET element, and the current path (2) is taken during an operation as a so-called IGBT element.

Further, when a ground potential is supplied with the external terminal ET, a negative potential is supplied to the external terminal CT and an OFF signal is supplied to the external terminal GT, the semiconductor device 100 functions as a diode element. Then a current path (3) is formed going through a path with a resistor R14 inside the semiconductor substrate 901 and reaching the N type semiconductor region 913.

A point where a current generated when the semiconductor device 100 operates as an IGBT element and a current generated when the semiconductor device 100 operates as a MOSFET element meet is herein referred to as an X1. Because the P type semiconductor region 912 and the N type semiconductor region 913 are separated by the trench isolation structure 911, the resistor R13 is present between the P type semiconductor region 912 and the X1 while the resistors R11 and R1 are present between the N type semiconductor region 913 and the X1. Therefore, it is possible to increase a resistance value between the external terminal CT and the X1, thereby easily increasing a potential difference between the external terminal CT and the X1. It is noted that while the resistor R1 exhibits a small resistance value, as in the case of the semiconductor device 90 shown in FIG. 2, the resistor R11 exhibits a considerably larger resistance value in comparison to the resistor R1.

Additionally in FIG. 13, regarding the resistors R12 and R13 inside the semiconductor substrate 901 when the semiconductor substrate 100 functions as an IGBT element, and regarding the resistor R14 when the semiconductor substrate 100 functions as a diode element, modulation is generated and a resistance value decreases as a voltage increases. Accordingly, a symbol indicating a variable resistor is used for the resistors R12 and R13. However, in case of a MOSFET element operation, the resistance value is approximately constant.

FIG. 14 conceptually shows current-voltage characteristics of the semiconductor device 100. That is, in FIG. 14, the horizontal axis represents voltage value and the vertical axis represents current value, to indicate four kinds of current-voltage characteristics that are characteristics A1, B1, C1 and D1. For comparison, characteristics A, B, C and D shown in FIG. 2 are also indicated.

The characteristic A1 shows the relationship of a current flowing at the external terminal CT and a potential difference between the external terminal CT and the X1 when the N type semiconductor region 913 is in an open state without being connected to the external terminal CT.

The characteristic B1 shows the relationship of a current flowing at the external terminal CT and a potential difference between the external terminal CT and the X1 when the P type semiconductor region 912 is in an open state without being connected to the external terminal CT.

The characteristic C1 shows the relationship of a current flowing at the external terminal CT and a potential difference between the external terminal CT and the external terminal ET when the N type semiconductor region 913 is in an open state without being connected to the external terminal CT.

The characteristic D1 shows the relationship of a current flowing at the external terminal CT and a potential difference between the external terminal CT and the external terminal ET when the P type semiconductor region 912 is in an open state without being connected to the external terminal CT.

Further, a characteristic A' shows a relationship of a current flowing at the external terminal CT and a potential difference between the external terminal CT and an X' when the N type semiconductor region 913 is in an open state without being connected to the external terminal CT.

The area of the P type semiconductor region 912 and the area of the N type semiconductor region 913 are both set in the same manner as for the semiconductor device 90 in FIG. 2. Therefore, the characteristics C1 and D1 are the same as the characteristics C and D shown in FIG. 3, respectively.

In contrast, a larger distance between the X1 and the N type semiconductor region 913 results in a larger resistance value therebetween (the sum of resistance values of the resistors R1 and R11), and the characteristic B1 shows a considerably gradual slope compared to the characteristic B.

As a result, even when a potential difference between the external terminal CT and the X1 reaches about 0.6 V and reaches a modulation voltage Vmod where modulation starts to be generated (a voltage indicated by the Z), almost no current flows and a voltage difference between the external terminal CT and the external terminal ET is small, thereby suppressing snapback. Here, a current ic flowing at the resistor R13 is almost 0 and the following relationship holds at the Z: Vmod=(R11+R1)×id. Since the resistor (R11+R1) has a large resistance value, the small current id can turn on a collector of the IGBT. The id here refers to an operating current of the MOSFET element, that is, a current flowing through the current path (1). In this case, it particularly refers to a current value at the Z. The current ic refers to an operating current of the IGBT element, that is, a current flowing through the current path (2) and equals to 0 at the Z.

As described above, snapback can be suppressed in the semiconductor device 100 and it is not necessary to reduce the proportion of an area of an effective region (the sum of areas of the P type semiconductor region 912 and the N type semiconductor region 913) in the second main surface MS2. Therefore, increase of an ON voltage at an IGBT element operation and a forward voltage Vf at a diode element operation as well as increase of a local current density at respective operations is prevented.

C. Manufacturing Method

Next, description is given of a manufacturing method of the semiconductor device 100 in reference to FIGS. 15 through 18. The structure on the side of the first main surface MS1 is obtained through the same manufacturing processes employed for IGBTs and MOSFETs conventionally known to the public. Therefore, description regarding the known technique is omitted.

FIGS. 15 through 18 are section views sequentially illustrating manufacturing steps for obtaining the structure on the side of the second main surface MS2. In the following description, it is assumed that the structure below the first main electrodes 908 on the first main surface MS1 side has been already formed.

Figure 15:
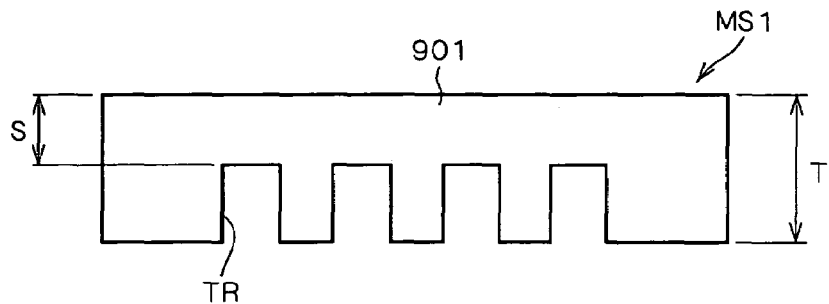
FIG. 15 is a section view illustrating a manufacturing step of the semiconductor device according to the embodiment of the present invention.

After forming the structure below the first main electrodes 908 (the structure being not shown) on the side of the first main surface MS1 of the semiconductor substrate 901, in the process shown in FIG. 15, trenches TR are formed in the second main surface MS2 of the semiconductor substrate 901 using photo lithography and anisotropic etching.

Here, a thickness T of the semiconductor substrate 901 is set to a thickness that hardly causes a crack or a chip on a semiconductor wafer during manufacturing process of a semiconductor device. Also, the thickness T is set to a thickness that does not require special adjustments in focal depth in an aligner and the like during the photo lithography process. Taking a 6-inch semiconductor wafer as an example, the thickness is set to between 500 to 650 μm. Further, a thickness S from the bottom of the trenches TR to the first main surface MS1 is determined in consideration of a reduction in an ON resistance and a withstand voltage. For example, for a semiconductor device with a withstand voltage of 600V, the thickness is set to 60 μm.

Additionally, any value can be given for a width and an arrangement interval of the trenches TR. For example, the width is set to 0.2 to 100 μm and the arrangement interval is set to 0.5 to 500 μm.

Figure 16:
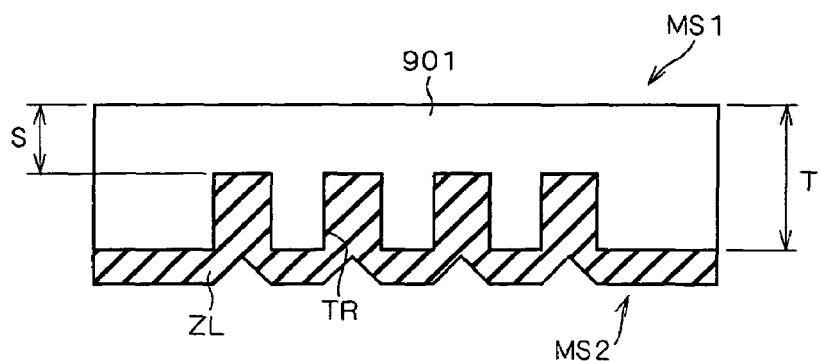
FIG. 16 is a section view illustrating a manufacturing step of the semiconductor device according to the embodiment of the present invention.

Next, in the step shown in FIG. 16, an insulating film ZL with a thickness greater than the width of the trench TR is deposited by a CVD method and the like on the entire second main surface MS2, thereby filling the insulating film ZL inside the trenches TR.

Figure 17:
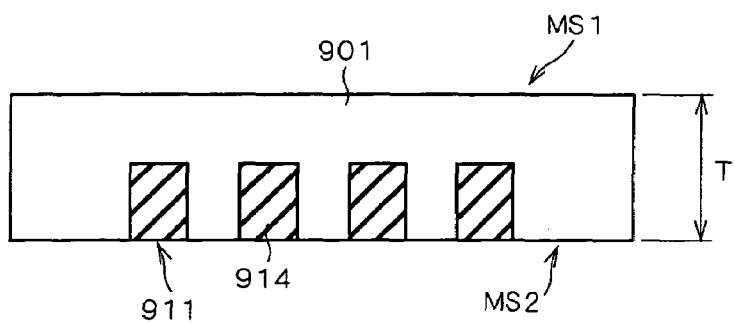
FIG. 17 is a section view illustrating a manufacturing step of the semiconductor device according to the embodiment of the present invention.

Then, in the step shown in FIG. 17, etch back is performed by anisotropic etching and the like to remove the insulating film ZL on the second main surface MS2, thereby obtaining the trench isolation structures 911 comprising the insulators 914.

Figure 18:
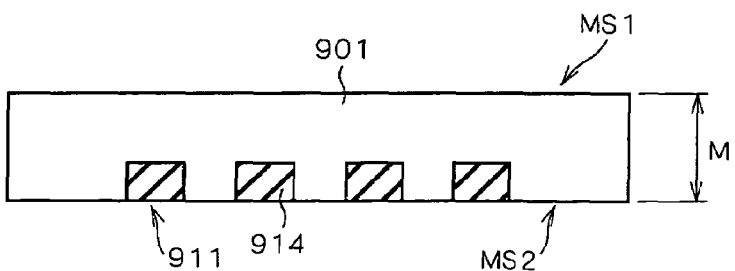
FIG. 18 is a section view illustrating a manufacturing step of the semiconductor device according to the embodiment of the present invention.

In case it is necessary to obtain a desirable property, in the step shown in FIG. 18, the second main surface MS2 side may be polished by anisotropic etching or a polishing method such as CMP (Chemical Mechanical Polishing), thereby obtaining a desirable substrate thickness. Naturally in this case, the relationship between a substrate thickness M after polishing, the thickness T and the thickness S is S<M<T.

Generally, the P type semiconductor regions 912 and the N type semiconductor regions 913 are formed before the trench isolation structures 911, and the trench isolation structures 911 is formed at the boundary between the P type semiconductor regions 912 and the N type semiconductor regions 913. In case a polishing mentioned in reference to FIG. 18 is performed, the P type semiconductor regions 912 and the N type semiconductor regions 913 are formed after the polishing.

Thereafter, a conductive material constituting the second main electrode 916 is deposited by an evaporation method and the like to obtain the structure on the side of the second main surface MS2.

The foregoing description specifies that the structure of the second main surface MS2 side is formed after the structure of the first main surface MS1 side is formed. However, this does not limit the formation of the structure of the second main surface MS2 side. Unless the trenches TR cause an adverse effect in the formation of the structure of the first main surface MS1 side, the structure of the second main surface MS2 side may be formed while forming the structure of the first main surface MS1 side.

Further, since it is desirable that the P type semiconductor regions 912 and the N type semiconductor regions 913 are fully activated by annealing, it is desirable that an annealing process is carried out after the formation of the P type semiconductor regions 912 and the N type semiconductor regions 913.

Moreover, timing to form the second main electrode 916 is not limited to the above description. Nevertheless, since a multilayered metal film structure including gold and silver is employed, it is desirable that the second main electrode 916 is formed in the final step of wafer processing.

D. Variation

In the above-described example of the semiconductor device 100, the semiconductor substrate 901 comprises an N type semiconductor substrate. Naturally, the same effect is also achieved when the semiconductor substrate 901 comprises a P type semiconductor substrate.

Further, the semiconductor device 100 has the configuration wherein the P type semiconductor regions 912 and the N type semiconductor regions 913 are both connected to the second main electrode 916 which covers both the P type semiconductor regions 912 and the N type semiconductor regions 913. This configuration is simple and does not require complex wiring and the like for connecting to the external terminal CT. In this regard, as shown in FIG. 19, a semiconductor device 100A presents another possible configuration wherein second main electrodes 916a connected to the P type semiconductor regions 912 and second main electrodes 916b connected to the N type semiconductor regions 913 are provided so that the P type semiconductor regions 912 and the N type semiconductor regions 913 respectively are connected to a separate main electrode.

In this case, since the second main electrodes 916b are connected to the external terminal CT via a resistor element 915, a resistance inside the semiconductor substrate 901 between the N type semiconductor regions 913 and the P type semiconductor regions 912 needs to be smaller than that of the semiconductor device 100. Therefore, the depth of trench isolation structures 911 can be reduced. It is noted that the second main electrodes 916a may be connected to a diode element or a transistor element as a current limiter in place of the resistor element 915. In this manner, the configuration of the P type semiconductor regions 912 and the N type semiconductor regions 913 being connected to a separate main electrode allows various structures to be applied.

Figure 19:
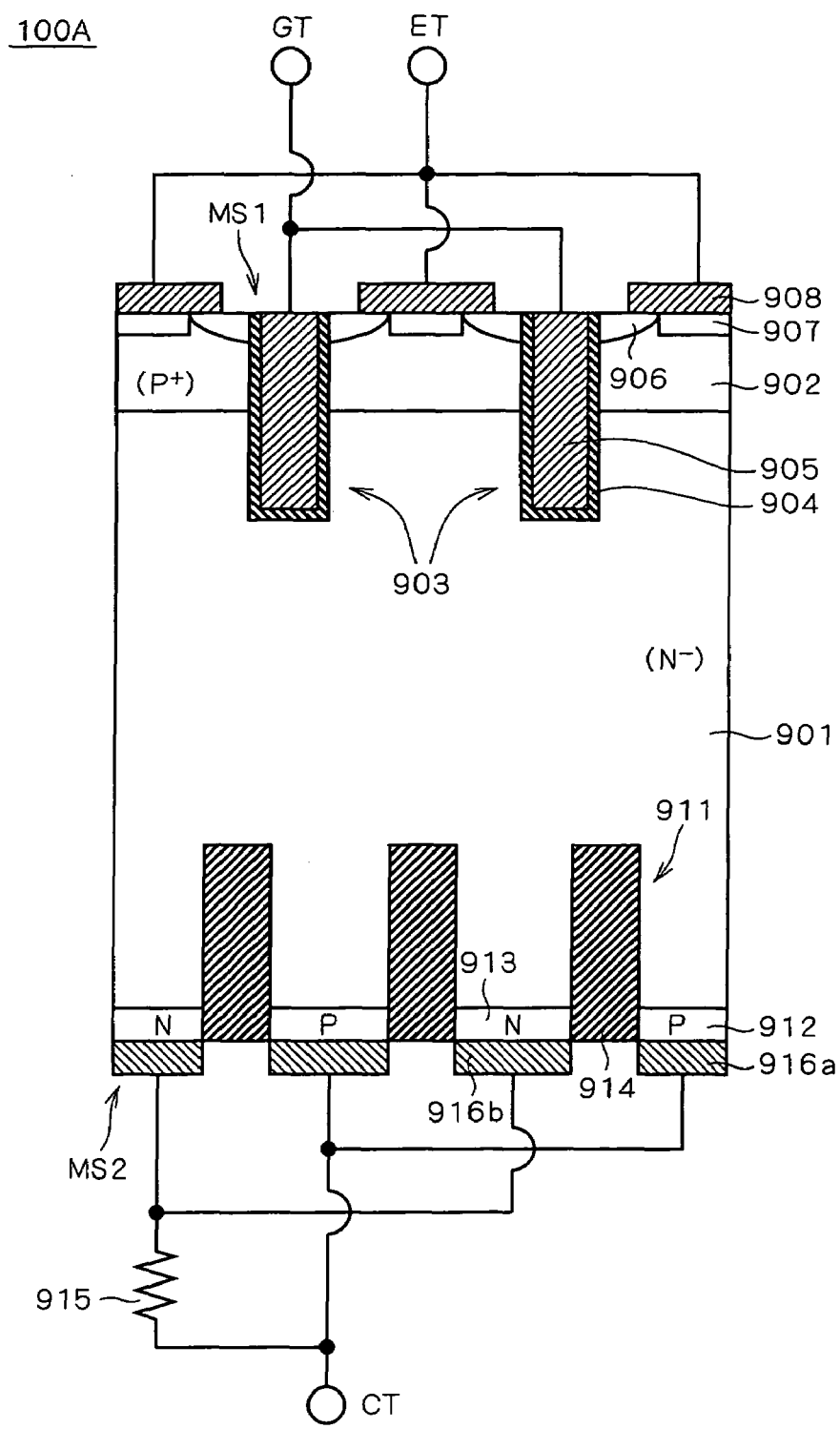
FIG. 19 is a section view illustrating a structure of a variation of the semiconductor device according to the embodiment of the present invention.

Further, as in the case of the semiconductor device 100 wherein the second main electrode 916 covers both the P type semiconductor regions 912 and the N type semiconductor regions 913, by selecting a material of the second main electrode 916 so that a contact resistance to the N type semiconductor regions 913 is greater than a contact resistance to the P type semiconductor regions 912, the same advantageous effect derived from the semiconductor device 100A shown in FIG. 19 can be achieved. For example, a metal with a large work function such as gold and silver can be used.

Also, the embodiment described an example wherein the trench isolation structures 911 are formed by filling the insulators in the trenches. In another possible configuration, the trench isolation structures may be formed by filling a high-resistance semiconductor of a conductivity type reverse to that of the semiconductor substrate 901 with an impurity concentration approximately equal to that of the semiconductor substrate 901 (for example, for an element with a withstand voltage of 1200V, an impurity concentration being $1 \times 10^{14}$ atoms/cm$^3$, a specific resistance being 50 to 60 ohms).

In case the trench isolation structures 911 are formed with a high-resistance semiconductor, an insulating film may be formed between the high-resistance semiconductor, the N type semiconductor regions 913 and the P type semiconductor regions 912. The above insulating film may or may not be formed at the bottom of the trench isolation structures 911.

Furthermore, the trench isolation structures 911 may consist of trenches alone, without filling an insulating material or a high-resistance semiconductor material inside the trenches TR.

Additionally, the application of the present invention is not limited only to an IGBT element and a diode element, and application to a thyristor element is also possible.

While the invention has been shown and described in detail, the foregoing description is in all aspects illustrative and not restrictive. It is therefore understood that numerous modifications and variations can be devised without departing from the scope of the invention.

The invention claimed is:

1. A semiconductor, comprising:
    a first main electrode provided on a first main surface of a semiconductor substrate;
    a second main electrode provided on a second main surface of said semiconductor substrate opposite to the first main surface in a direction of the thickness of said semiconductor, and configured to allow a main current to flow in the direction of the thickness of said semiconductor substrate; and
    at least one trench-type gate electrode provided in said first main surface,
    said semiconductor substrate comprising
        at least one trench isolation structure provided in said second main surface, and
        a first impurity region of a first conductivity type and a second impurity region of a second conductivity type provided in said second main surface, wherein
        said at least one trench isolation structure includes a trench in said second main surface filled with an insulator or a semiconductor of a conductivity type reverse to that of said semiconductor substrate, said at least one trench isolation structure configured to separate said first impurity region and said second impurity region,
    wherein an exposed surface of said at least one trench isolation structure provided in the portion of said second main surface is level with an exposed surface of said first and second impurity regions, and
    said second main electrode covers said at least one trench isolation structure and said first and second impurity regions and is electrically commonly connected to them.

2. The semiconductor according to claim 1, wherein said at least one trench isolation structure is configured such that an electrical charge inside said insulator has a polarity reverse to an electrical charge inside said semiconductor substrate and a total quantity of the electrical charge of said at least one trench isolation structure is approximately equal to a quantity of the electrical charge of a section of said semiconductor substrate from said second main surface to the bottom of said at least one trench isolation structure.

3. The semiconductor according to claim 1, wherein a width of said at least one trench isolation structure is set to a value in a range between 0.2 to 100 µm and an arrangement interval is set to a value in a range between 0.5 to 500 µm.

* * * * *